Sept. 28, 1965

C. E. HILL 3,208,921

METHOD FOR MAKING PRINTED CIRCUIT BOARDS

Filed Jan. 2, 1962

2 Sheets-Sheet 1

INVENTOR.
CLARENCE E. HILL
BY
Henry Heyman
ATTORNEY

Sept. 28, 1965 C. E. HILL 3,208,921

METHOD FOR MAKING PRINTED CIRCUIT BOARDS

Filed Jan. 2, 1962

2 Sheets-Sheet 2

INVENTOR.
CLARENCE E. HILL
BY
[signature]
ATTORNEY

United States Patent Office 3,208,921

Patented Sept. 28, 1965

3,208,921

METHOD FOR MAKING PRINTED CIRCUIT BOARDS

Clarence E. Hill, Massapequa, N.Y., assignor to Sperry Rand Corporation, Great Neck, N.Y., a corporation of Delaware Filed Jan. 2, 1962, Ser. No. 163,590
2 Claims. (Cl. 204—15)

Figure 1:
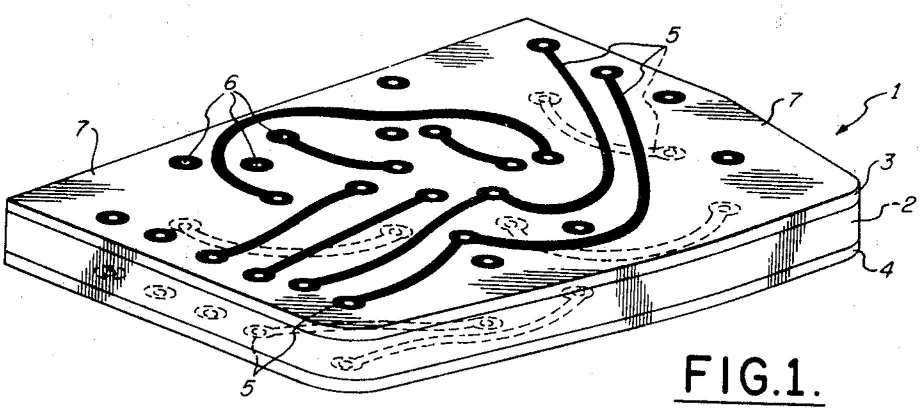

The present invention generally relates to the manufacture of printed circuits mounted on the opposite faces of an insulating board and, more particularly, to a method specially suited for making subminiature printed circuits having "plated-through hole" electrical connections between the circuits mounted on the opposite faces of the insulating board.

Several methods, including the one disclosed in U.S. Patent 2,872,391 issued to J. H. Hauser et al., on February 3, 1959, are available in the art for producing "plated-through hole" printed circuit boards. According to the established techniques, the printed circuits which are formed on the opposite faces of an insulating board are connected to each other at predetermined points by electrical conductors which pass internally through the board. The internal connectors are made by drilling holes through the board between said predetermined points and then lining the exposed interior surfaces of the board (surrounding the drilled holes) with a suitable electrically conductive material.

It is generally preferred to use a process whereby the surface circuit conductors and the "plated-through hole" connectors of the printed circuits are simultaneously coated with the same conductive material in order to achieve a total circuit of high mechanical strength. It is also desirable that the circuit conductors which lie on the opposite faces of the board be made by using a copper clad mounting board and then etching away the copper cladding in the non-circuit surface areas. The use of the copper clad mounting board and the etching technique make certain that the resulting printed circuit structure is firmly bonded to the surface of the mounting board whereby the reliability of the product is substantially enhanced.

No particular problems are encountered in employing the aforementioned techniques when producing printed circuits of ordinary scale. However, serious problems are encountered in achieving proper registration between the surface circuit conductors and the internal connectors and in avoiding undercutting damage to the surface circuit portions during the etching of the copper clad board when attempts are made to fabricate subminiature printed circuits. Unless exacting control techniques are adopted, a substantial increase in the number of costly rejects may be expected where conventional techinques are used for the manufacture of subminiature circuits of the character described. One object of the present invention is to provide a method for the fabrication of printed circuit boards which simplifies the problem of achieving proper registration between the external circuit conductors and the internal connectors established between said conductors.

Another object is to provide a method specially adapted for the production of subminiature printed circuits mounted on the opposite faces of an insulating board having internal connections through the board between predetermined points on said circuits.

A further object is to provide a method for producing etched printed circuits mounted on the opposite faces of a copper clad insulating board and having "plated-through hole" connectors whereby damage of the circuit conductors due to etching is substantially reduced.

These and other objects of the present invention, as will appear from a reading of the following specification, are accomplished by the provision of an improved method for producing chemically etched printed circuits derived from a copper clad insulating board. Internal electrical connectors are provided through the board for connecting predetermined points on the circuits mounted on the opposite faces of the board. The first step of the procedure is to form predetermined conductive circuit patterns on the opposite faces of a copper clad insulating board by selectively chemically etching the copper cladding from the noncircuit areas. This is accomplished by application of standard photo-resist and etching techniques except that small circular areas of the copper cladding are also removed from circuit locations at which "plated-through hole" connectors are to be formed. The small circular areas are removed by the same photo-resist etching process which establishes the surface circuit patterns and serve as drill centering marks.

After the copper cladding is removed from the noncircuit areas and the aforesaid drill centering marks are established on both faces of the board, the board is completely covered with a thin layer of conductive material such as electroless copper. The thin layer of conductive material, in turn, is then entirely coated with a resist material such as a stripable vinyl stop-off lacquer to protect the conductive layer against subsequent plating operations.

The surface circuit patterns including the drill centering marks are clearly visible through both the thin layer of conductive material and the overall layer of resist. Holes are drilled through the board at the locations of the drill centering marks to provide paths for the internal circuit connectors. The use of the etched small circular areas as drill centering marks completely eliminates the need for fixtures or other devices for locating the holes accurately relative to the surface circuit conductors already established.

After the holes have been drilled, a thin conductive layer is placed on both the surface circuit conductors which have been exposed by a sanding operation and the internal surfaces of the board surrounding the holes. Then, the layer is increased to full current carrying thickness by the electrodeposition of copper. The electrodeposited copper forms the surface circuit conductors and the "plated-through hole" connectors into one integral and structurally sound member. Provision is also made in accordance with the present invention for placing optional coatings such as tin-lead or gold on the entire circuit areas and for removing the thin layer of conductive material on the noncircuit areas to yield the finished printed circuit.

For a more complete understanding of the invention, reference should be had to the drawings which represent the printed circuit as it appears at selected intervals of interest during the course of the present method. The dimensional relationships have been exagerated in the drawings for the sake of clarity.

Referring to FIG. 1, copper clad board 1 consists of a layer of insulating material 2 sandwiched between two layers 3 and 4 of copper. The board is cut to the required size and the surfaces of the copper are freshened by scrubbing with a slurry of pumice and water, washed, and then dried. Both of the exposed faces of layers 3 and 4 are coated by conventional photo engraving methods with a standard photographic acid resist material. The resist used must be capable of withstanding the action of etching solutions and the effects of of plating operations which are employed later in the process of the present invention.

After the photographic resist is applied to the entire exposed surface of copper layers 3 and 4, board 1 is placed between a pair of photographic negatives which are registered in such a manner that the "hole" location of one negative lies directly above the respective hole location of the other negative. The resulting assembly is exposed on both sides to a suitable light source for the appropriate time as indicated by the manufacturer of the resist being used. The latent images on the exposed board are developed in the recommended resist developer and dried to form a protective resist pattern such as pattern 5 on both faces of board 1 at locations at which the printed circuit surface conductors are desired. The board is immersed in an appropriate etching solution such as, for example, 25% ammonium persulfate, at 120° F. until all the copper cladding on the unprotected non-circuit areas 7 has been completely etched away to expose the base insulation material 2 in all non-circuit areas. The resist then is removed to yield the surface circuit conductors 3 represented in FIG. 2.

An important feature of the present method is the provision of drill centering marks or recesses at locations within the etched circuit patterns at which holes are to be drilled. Both the centering marks and the conductive circuit pattern are produced during the same etching step. Each of the photographic negatives used in sensitizing the layers of resist material includes a plurality of small circular transparent areas corresponding to locations 6 at which drill centering marks are desired.

When the assembly including the photographic negatives is exposed to the light source, only the resist pattern 5 is sensitized. The resist material at locations 6 and on the non-circuit areas 7 as determined by the photographic negatives remain unexposed. When the exposed assembly is immersed in the resist developer, the unexposed resist material is washed away exposing the copper cladding 3 in the non-circuit areas 7 and in the areas 6, each of the latter areas being surrounded by portions of the resist pattern 5. The exposed cladding is removed at said areas when the assembly is bathed in the etching solution.

It should be noted that the unwanted areas of layers 3 and 4 are etched away at a time when the thickness of the copper cladding is a minimum and before any significant investment of labor and materials is made in the printed circuit. Experience has shown that the tendency of the etching bath to undercut the desired circuit conductors is lessened when the thickness of the copper cladding is at a minimum. If, for example, the original thickness of the circuit conductors were increased by the addition of other conductive layers in subsequent steps of the fabrication process, the side edges of the desired circuit conductors would be attacked by the etching solution and seriously undercut during the time that the copper cladding in the non-circuit was being etched away. In some cases, the undercutting not only impairs the bonding of the circuit conductors to the insulating board 2, but also seriously reduces the cross sectional areas of the circuit conductors, sometimes completely cutting through and disrupting the circuit conductors. In accordance with the present method, however, the undercutting of the circuit conductors is substantially reduced due to the minimum original thickness of the copper cladding being etched away in the non-circuit areas.

The circuit board is inspected immediately upon the completion of the etching operation. In the event that the conductive circuit patterns on both faces of the mounting boards fails to meet specification for any reason, it is at once discarded before any additional investment is made toward completing the final product. It should be observed that the etching step is the most critical one in the entire process, particularly where subminiature circuits are being made and dimensional tolerances are close. The likelihood of rejects being encountered in subsequent steps of the fabrication process is considerably less. This is in contradistinction to prior art techniques for making "plated-through hole" printed circuit boards in which the etching of the copper cladding in the non-circuit areas is relegated to the end of the process after the holes have been located, drilled and conductively lined. Thus, the likelihood of rejects occurring is increased at a time when the investment in the printed circuit board is at a maximum.

Figure 2:
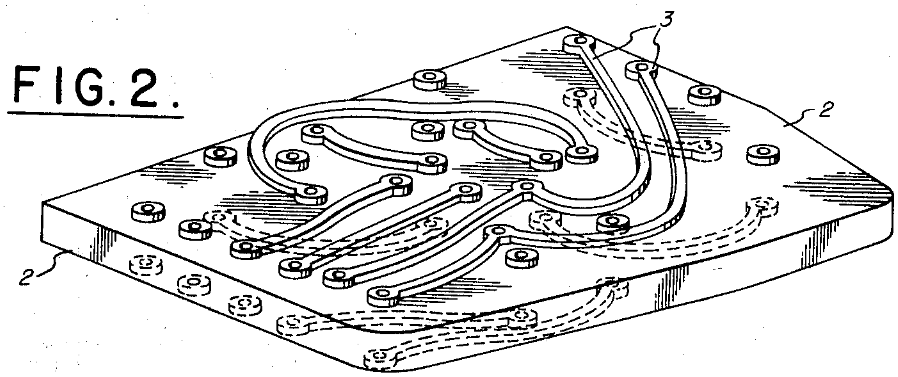

Returning to the present method, the etched circuit board represented in FIG. 2 next is immersed in a wetting agent and then in a stannous chloride solution consisting of, for example, 70 grams stannous chloride, 40 cc. hydrochloric acid, and one liter of water for a period of about three minutes at room temperature. The board is removed from the solution, rinsed in cold running water and then placed into a solution of palladium chloride consisting of, for example, 1/10 gram palladium chloride, 1 cc. hydrochloric acid and one liter of water. In this manner, the board is sensitized or made receptive to the deposition of a metallic film on the entire circuit and non-circuit areas of the mounting board. The film is deposited by immersing the board in a solution which chemically deposits a metallic thin film 8 of conductive material such as copper, nickel, or silver to a thickness of about .0001 inch over the entire exposed surface of the board. The metallic film is used in a subsequent step of the present fabrication method wherein electrical connections are established through the board between the circuits formed on the opposite faces of the board. More particularly, the metallic film is utilized in electroplating the interior surfaces of board 2 which will surround the holes when they are drilled later at each of the locations 6 shown in FIG. 1.

Alternately, the required conductive coating may be applied to the board by the dip, spray, or roller coating of a conductive paint over the entire exposed surfaces of the board. Highly conductive graphite, silver or copper paint is suitable so long as it can be removed later by vapor degreasing or by another solvent agent.

Figure 3:
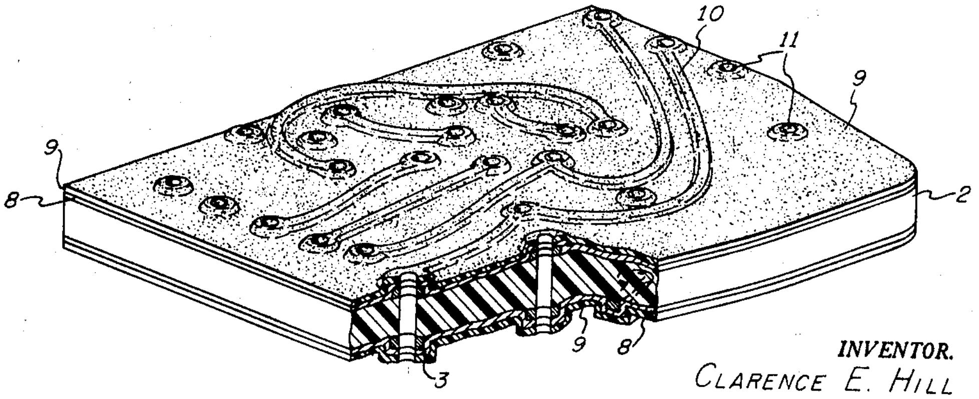

The entire conductive layer 8 of FIG. 3 is protected against overall plating in subsequent operations by the application of a resist material 9 such as a stripable vinyl stop-off lacquer or any other suitable plating resist paint or lacquer. The resist coating is then dried in accordance with manufacturer's recommendations, the average drying cycle lasting approximately one hour at a temperature of about 150° F. to about 180° F.

It should be observed that the contours 10 of the surface circuit patterns including the drill centering marks or recesses 11 are clearly visible in FIG. 3 through both the thin layer of conductive material 8 and the overall layer 9 of resist. Using the marks 11 that appear in the resist covering, holes of the required size are either drilled or punched through the entire board to provide paths for the internal circuit connections.

At this point, either one of two additional series of processing steps may be performed. If desired, conductive linings may be applied only to the internal surfaces of the board 2 surrounding the drilled holes. In this case, the overall layer 9 of resist material is left intact. It is preferred, however, that the resist material 9 be removed from the raised areas (covering the desired circuit pattern) before applying any conductive linings to the interior surfaces of the apertured board. It is convenient to remove the resist material by abrading the raised surfaces of the circuit board with emery paper backed up by a flat-surfaced holding block of suitable size. The abrading may be continued to remove not only the resist material but the conductive coating 8 as well from all the raised circuit areas.

The abraded board is immersed in a wetting agent and given a brief cold water rinse. The board is then placed in a stannous chloride solution as previously described for a period of approximately 3 minutes at room temperature. This is followed by a cold water rinse of about 1 minute and immersion in a palladium chloride solution similar to the one described earlier.

Figures 4, 4A:
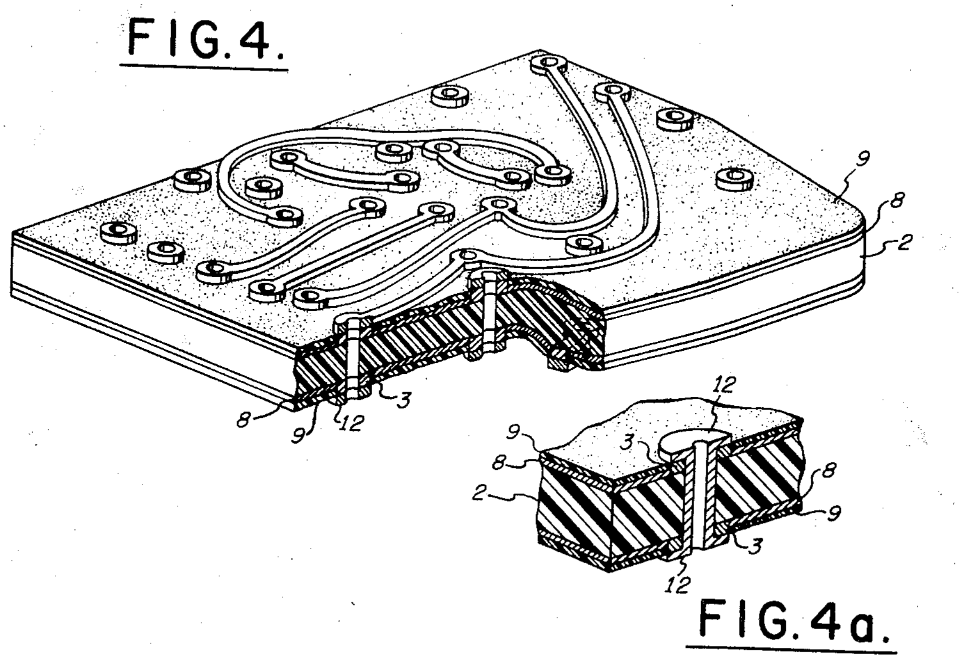

The internal surfaces of the board surrounding the drilled hole as well as the abraded circuit conductor surfaces are now in the proper condition preparatory to the formation of the conductive layer 12 of FIG. 4. The base for the conductive layer 12 is produced by immersing the board in an appropriate conventional solution that will chemically reduce metallic copper, nickel, silver or any other suitable metallic film on the hole boundary surfaces and on the existing copper layer 3. The thickness of the chemically reduced metallic coating is of the order of about .0001 inch. At this juncture, the noncircuit areas of board 2 of FIG. 4 still remain covered by the thin metallic layer 8 and the layer of resist material 9.

After the board has had the desired thickness of the chosen metallic under coating applied, the sensitization of the abraded conductive surfaces of the printed board is removed by application of a 25% ammonium persulfate solution followed by a cold water rinse. This assures a properly prepared surface for subsequent plating. The conductive layer is increased to full current carrying or required dimensional thickness by placing the board in a copper electroplating bath until the thickness of the conductive hole linings is increased to about .001. This is shown more clearly in the enlarged sectional view of FIG. 4*a*. The electroplating of the copper on the exposed surface circuit conductors and on the hole linings is facilitated by the underlying layer 8 of conductive material shown in FIG. 4 which electrically connects together all the desired circuit areas for the electroplating operation.

The printed circuit board resulting from the fabrication method described so far is complete except for the removal of the resist layer 9 and the conductive layer 8 which cover the non-circuit areas. Before proceeding with the removal of the non-circuit area materials, however, it is convenient to apply any desired finish coating such as, for example, tin-lead or gold to the circuit conductor and hole linings. After this has been done, the resist layer 9 may be removed by an appropriate solvent and the thin layer 8 may be taken off the non-circuit areas by brief immersion in an etching solution. It should be noted that the etching solution would not substantially effect the circuit conductors during the extremely brief interval required to remove layer 8 even if the circuit conductor were not covered by a final tin-lead or gold protective coating.

Figure 5:
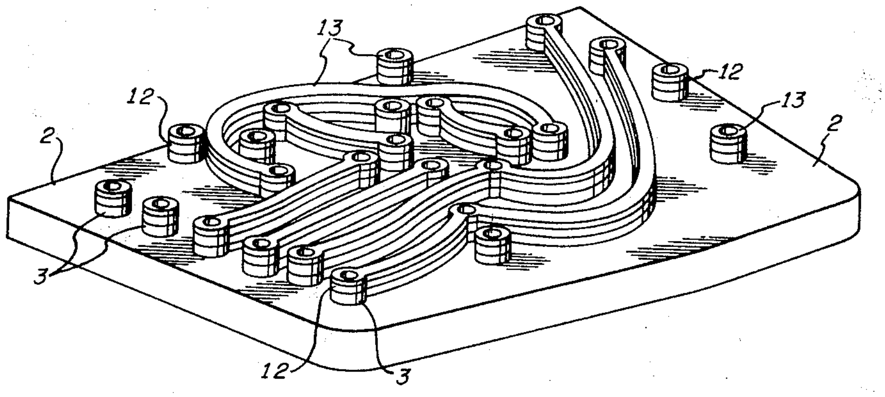

The final product is shown in FIG. 5. It comprises an insulating board 2 having eletcrical circuits formed on the opposite faces of the board. The circuits are connected to each other at predetermined points by "plated-through hole" electrical connectors. Each of the conductors lying on the surfaces of the printed circuit board comprises a first layer 3 of the original copper cladding of the board, a covering layer 12 of additional copper deposited as one continuous member on top of layer 3 and on the internal surfaces on board 2 surround the drilled holes. The additional layer 12, in turn, is coated in the preferred case with an optional layer 13 of tin-lead or gold. The board is now ready for circuit component insertion and soldering to obtain the desired final assembly.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. A method for producing printed circuits mounted on the opposite faces of a conductively clad insulating board having electrical connections through the board between predetermined points on said circuits, said method comprising the steps of:

coating said opposite faces of said board with a photographic resist, selectively exposing predetermined areas of said resist at which circuit conductors are to be formed so that exposed areas surround unexposed resist locations at which holes are to be cut through said board, the unexposed resist locations on one face of said board being in registration with respective unexposed resist locations on the other face of said board, removing the unexposed resist and the conductive cladding lying beneath said unexposed resist, covering said opposite faces of said board with a layer of conductive material, said layer of conductive material being thin relative to the thickness of said conductive cladding, covering said layer of conductive material with a layer of resist material, cutting holes through said board at said unexposed resist locations, electroplating conductive linings on the interior surfaces of said board surrounding said holes, and removing said layer of resist material and said layer of conductive material.

2. A method for producing printed circuits mounted on the opposite faces of a copper clad insulating board having electrical connections through the board between predetermined points on said circuits, said method comprising the steps of:

coating said opposite faces of said board with a photographic resist, selectively exposing predetermined areas of said resist at which circuit conductors are to be formed so that exposed areas surround unexposed resist locations at which holes are to be drilled through said board, the unexposed resist locations on one face of said board being in registration with respective unexposed resist locations on the other face of said board, removing the unexposed resist, etching away the copper cladding lying beneath said unexposed resist, covering said opposite faces of said board with a layer of conductive material, said layer of conductive material being thin relative to the thickness of said copper cladding, covering said layer of conductive material with a layer of resist material, drilling holes through said board at said unexposed resist locations, removing said layer of resist material where it covers said circuit conductors, eletcroplating conductive linings on said circuit conductors and on the interior surfaces of said board surrounding said board, and removing said layer of resist material and said layer of conductive material.

References Cited by the Examiner

UNITED STATES PATENTS

| | | | |
|---|---|---|---|
| 2,506,604 | 5/50 | Lokker et al. | 204—15 |
| 2,872,391 | 2/59 | Hauser et al. | 204—15 |
| 2,934,479 | 4/60 | Deer | 204—15 |

JOHN H. MACK, *Primary Examiner.*

JOSEPH REBOLD, *Examiner.*